US010050624B2

(12) United States Patent
Lin

(10) Patent No.: US 10,050,624 B2
(45) Date of Patent: Aug. 14, 2018

(54) PROCESS-COMPENSATED LEVEL-UP SHIFTER CIRCUIT

(71) Applicant: Cavium, Inc., San Jose, CA (US)

(72) Inventor: David Lin, Westborough, MA (US)

(73) Assignee: Cavium, Inc., San Jose, CA (US)

( * ) Notice: Subject to any disclaimer, the term of this patent is extended or adjusted under 35 U.S.C. 154(b) by 0 days.

(21) Appl. No.: 15/420,343

(22) Filed: Jan. 31, 2017

(65) Prior Publication Data

US 2017/0338822 A1 Nov. 23, 2017

Related U.S. Application Data

(60) Provisional application No. 62/338,160, filed on May 18, 2016.

(51) Int. Cl.
*H03L 5/00* (2006.01)
*H03K 19/0185* (2006.01)
*H03K 19/003* (2006.01)

(52) U.S. Cl.
CPC ........... *H03K 19/018521* (2013.01); *H03K 19/00384* (2013.01)

(58) Field of Classification Search
None
See application file for complete search history.

(56) References Cited

U.S. PATENT DOCUMENTS

| | | | |
|---|---|---|---|
| 5,532,619 A * | 7/1996 | Bonaccio | G05F 3/265 326/124 |
| 7,564,288 B2 * | 7/2009 | Seki | H03K 3/013 326/63 |
| 7,567,111 B2 | 7/2009 | Seki et al. | |
| 7,656,221 B2 * | 2/2010 | Maejima | H02M 3/07 327/534 |
| 7,839,171 B1 * | 11/2010 | Miles | H03K 3/011 326/63 |
| 7,855,575 B1 | 12/2010 | Hsu et al. | |
| 7,884,644 B1 | 2/2011 | Wu et al. | |
| 7,884,645 B2 | 2/2011 | Chen et al. | |
| 8,044,683 B2 * | 10/2011 | Jung | H03K 19/01852 326/68 |
| 8,102,199 B2 | 1/2012 | Chou et al. | |
| 8,217,703 B2 | 7/2012 | Hurrell | |
| 8,258,848 B2 * | 9/2012 | Chen | H03K 3/35613 326/68 |
| 8,334,709 B2 | 12/2012 | Kuge | |
| 8,339,177 B2 | 12/2012 | Jarrar et al. | |
| 8,525,572 B2 * | 9/2013 | Lin | H03K 19/0013 326/80 |
| 9,083,352 B2 * | 7/2015 | Hirata | H03L 5/02 |
| 9,432,007 B1 * | 8/2016 | Gong | H03K 5/1252 |
| 2008/0224632 A1 * | 9/2008 | Noda | H05B 33/0812 315/291 |

(Continued)

*Primary Examiner* — Lincoln Donovan
*Assistant Examiner* — Khareem E Almo
(74) *Attorney, Agent, or Firm* — Hamilton, Brook, Smith & Reynolds, P.C.

(57) ABSTRACT

A level-up shifter circuit is suitable for high speed and low power applications. The circuit dissipates almost no static power, or leakage current, compared to conventional designs and can preserve the signal's duty cycle even at high data rates. This circuit can be used with a wide range of power supplies while maintaining operational integrity, and includes circuitry to compensate for process variations.

18 Claims, 11 Drawing Sheets

(56) References Cited

U.S. PATENT DOCUMENTS

| | | | | |
|---|---|---|---|---|
| 2011/0156825 A1* | 6/2011 | Aruga | ................... | H03K 3/354 |
| | | | | 331/108 A |
| 2012/0043968 A1* | 2/2012 | Kojima | .............. | G01R 31/2851 |
| | | | | 324/537 |
| 2016/0336955 A1* | 11/2016 | Matsuzawa | ............. | H03M 1/60 |

* cited by examiner

PROCESS-COMPENSATED LEVEL-UP SHIFTER CIRCUIT

RELATED APPLICATION

This application claims the benefit of U.S. Provisional Application No. 62/338,160, filed on May 18, 2016. The entire teachings of the above application are incorporated herein by reference.

BACKGROUND

A level-up shifter is an essential element for input/output (IO) design that handles signals crossing from a core power supply domain to an IO power supply domain, where the IO supply voltage is higher than that of the core supply. For the full-swing GHz high speed signals, a level-up shifter that can handle rail to rail signal level and preserve duty cycle fidelity is desirable. Further, as power dissipation becomes an important factor in IC design, it is critical to reduce DC current paths. Because a level-up shifter must transfer signals from one power domain to another, short-circuit currents may still be present when driving a static DC level, particularly as the difference between core and IO supply grows larger.

SUMMARY

Example embodiments of the invention provide a level-up shifter circuit suitable for high speed and low power applications. This circuit design dissipates minimal or negligible static power, or leakage current, compared to conventional designs and can preserve the signal's duty cycle even at high data rates. This circuit can be used with a wide range of power supplies while maintaining operational integrity.

In example embodiments, a level-up shifter may include first, second and third buffers and first through fifth transistors, and a compensation circuit. The first buffer may be configured to receive an input signal in a first power domain. The first, second and third transistors may be connected in series between a source rail in a second power domain and ground rail, where gates of the second and third transistors are connected to the output of the first buffer. The second and third buffers may be connected in series, an output of the second buffer being connected to an input of the third buffer, an input of the second buffer being connected to a node between the second and third transistors, and the third buffer outputting an output signal in the second power domain. The fourth and fifth transistors may have respective gates connected to the input signal and respective drains connected to a gate of the first transistor. The compensation circuit may include a first variable resistor connected between the source rail in the second power domain and an output of the third buffer, and a second variable resistor connected between the ground rail and the output of the third buffer.

In further embodiments, the first and second variable resistors may each include a plurality of transistors connected in parallel. The compensation circuit may also include one or more control transistors having a gate connected to the node between the second and third buffers.

In yet further embodiments, the buffers may each include an inverter, and the first buffer may be configured to be powered by a power signal in the first power domain. Conversely, the second and third buffers may be configured to be powered by a power signal in the second power domain. The first power domain may correspond to a power domain of a central processing unit, and the second power domain may correspond to a power domain of a communications bus for interfacing with the central processing unit. The third buffer may maintain the output signal at a substantially constant duty cycle corresponding to a high-speed input signal, across substantial variations in process, voltage and temperature variations at the level-up shifter circuit.

In still further embodiments, the level-up shifter may be configured to minimize static current consumption when in an idle state. The fourth transistor may have a source connected to the node between the second and third buffers, and the node between the second and third buffers is connected to the gate of the first transistor via the fourth transistor. Further, sixth and seventh transistors may be connected in series between the ground rail and a node between the second and third buffers. A gate of the sixth transistor is connected to a control signal, and a gate of the seventh transistor is connected to the input signal.

In yet further embodiments, a calibration circuit may be provided to adjust resistance values of the first and second variable resistors. The calibration circuit may include a finite state machine configured to output a plurality of calibration values to the first and second variable transistors. The calibration circuit may also include one or more comparators configured to compare a voltage based on the plurality of calibration values against a reference voltage and output a comparison value to the finite state machine. In response, the finite state machine may adjust the plurality of calibration values based on the comparison value.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION

A description of example embodiments of the invention follows.

Figure 1:
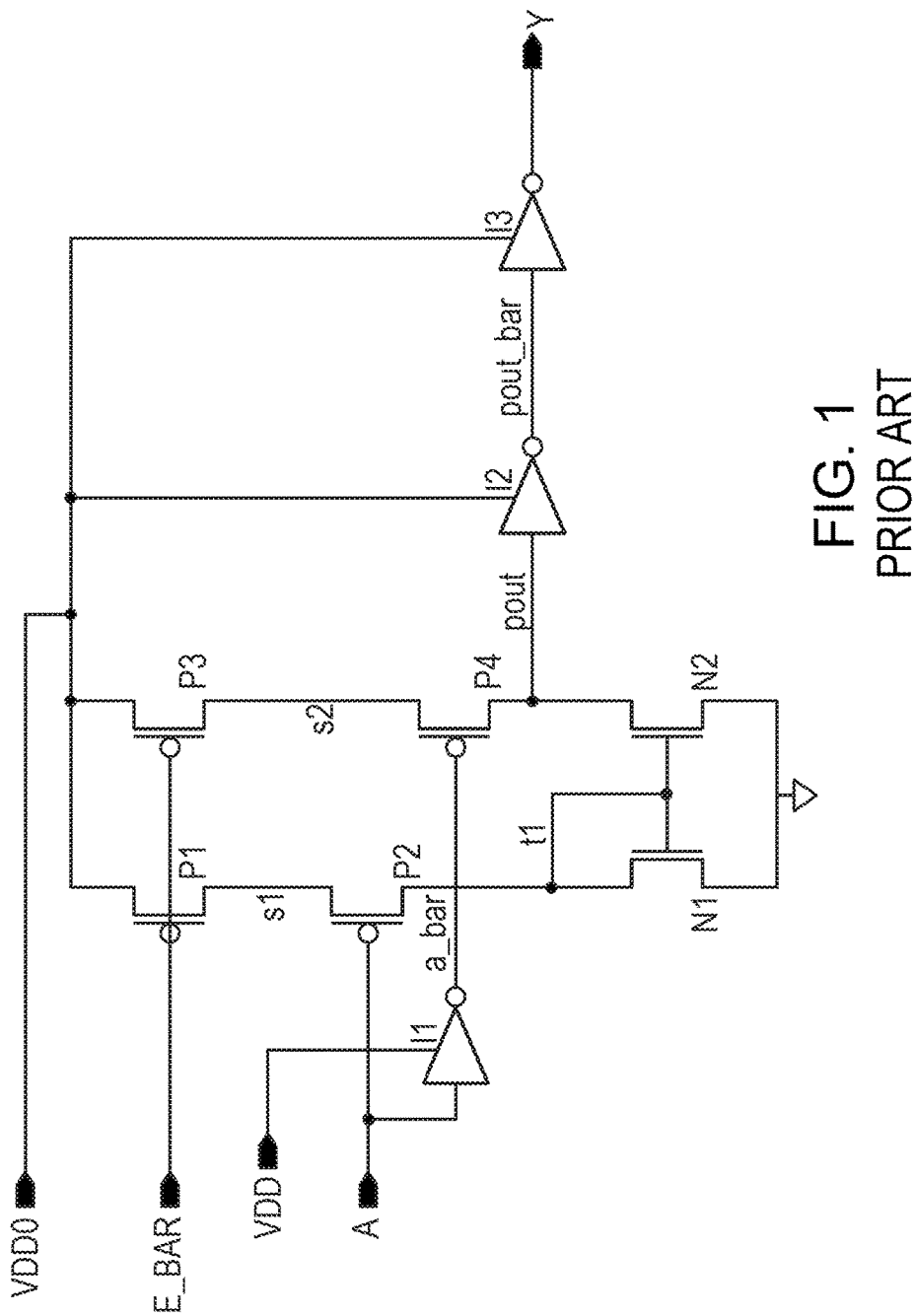
FIG. 1 is a circuit diagram of a typical level-up shifter circuit.

FIG. 1 is a circuit diagram of a typical level-up shifter circuit. Conventional level-up shifters have been implemented in high-speed signals interfacing between the core power domain and the IO power domain. As shown in FIG. 1, pin A is the input signal and is in the core power domain, indicated as pin VDD. A buffer (e.g., an inverter) receives the input signal, which is the signal that is to be shifted up to the IO power domain, indicated as VDDO pin. Pin E_BAR is the enable signal that enables the function of this level-up shifter if E_BAR=0. Pin Y is the output signal being shifted up.

Logically, the conventional shifter design of FIG. 1 appears to operate to output an up-shifted signal corresponding to the input at pin A. However, in actual implementation, there is an inevitable DC current path from VDDO to ground either through PFET P1, P2 and NFET N1, or through PFET P3, P4 and NFET N2. Given inputs A=1, E_BAR=0, and VDD<VDDO, for example, logically PFET P2 should be shut off and PFET P4 should be turned on and both P1 and P3 should be on as well, therefore producing a logical 1 on the Y pin. However, due to the difference between voltage level of VDD and VDDO, a logical 1 in VDD may not necessarily mean a logical 1 in the VDDO domain. If the difference between VDD and VDDO is greater than the threshold voltage of PFET, which is Vgs<Vth (both Vgs and Vth are negative since this is for PFET), then PFET P2 is being turned on, and causes node t1 to be raised above 0 v. Depending on the difference between VDD and VDDO, node t1 can be raised higher than the threshold voltage of NFET, and causes NFET N1 and N2 to be turned on as well. Once NFET N1 and N2 are on, it would create a DC current path from VDDO to ground. This is undesirable leakage current that happens constantly. This effect is referred to as static power dissipation. Even if the difference between VDD and VDDO is not high enough to be above the threshold voltage of PFET, the PFET may still be in the sub-threshold region, and a small amount of leakage current is still inevitable.

To minimize the DC current, transistors P1 and P3 can be configured such that there are two-high stacks PFETs. Even though E_BAR is intended to be a feature to enable or disable the level-up shifter, E_BAR=logical 1 is not really capable of shutting off P1 and P3 completely as E_BAR is a signal in VDD domain. PFETs P1 and P3 are also subject to the Vgs vs Vth relationship as well. Because of this constraint, this design is only suitable for the application in which the VDD and VDDO difference is not that high. Even in situations where VDD and VDDO are close, it is still susceptible to sub-threshold leakage current if there is a finite difference between them that creates a non-zero Vgs on the PFETs.

Figure 2:
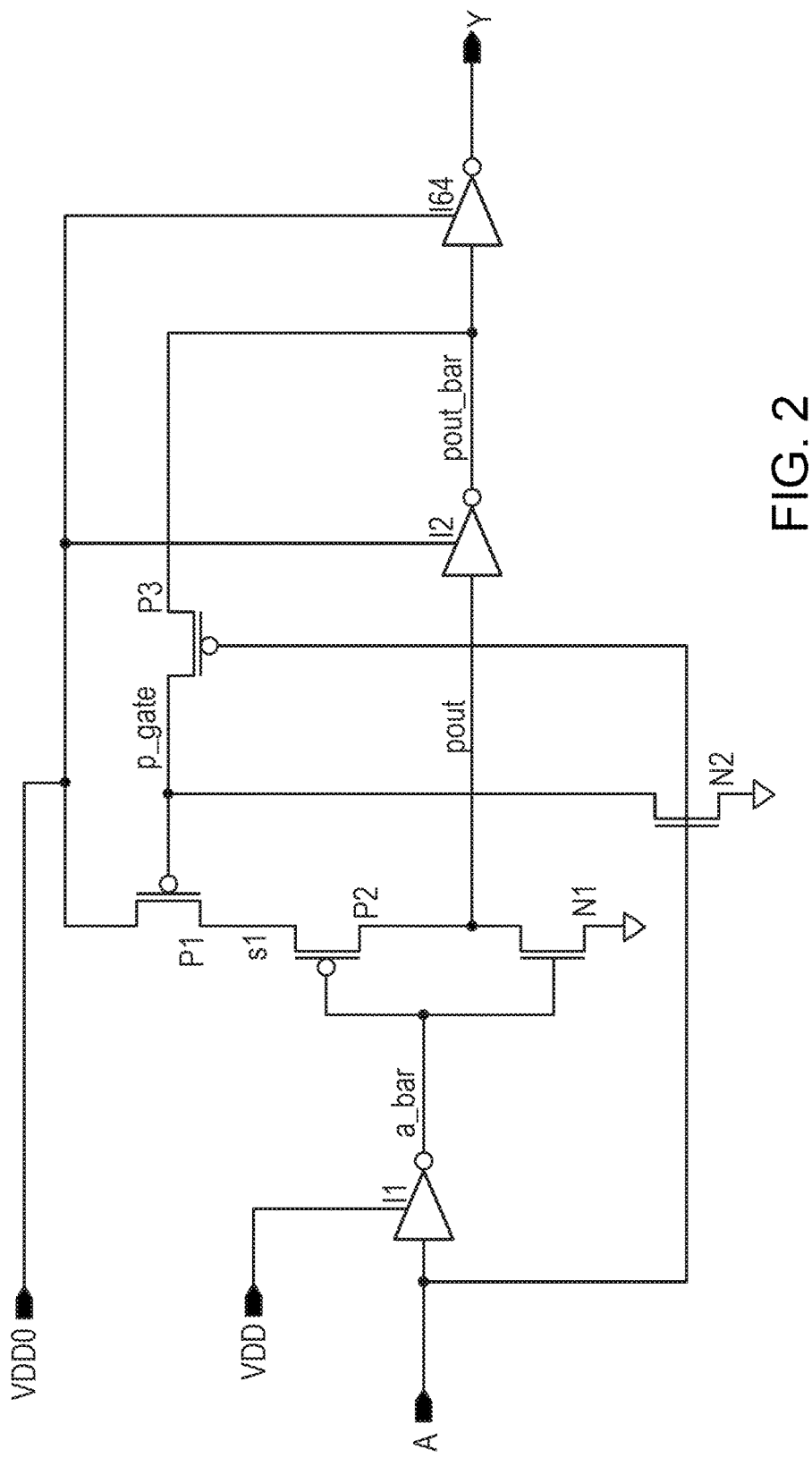
FIG. 2 is a circuit diagram of a level-up shifter circuit in an example embodiment.

FIG. 2 is a circuit diagram of a level-up shifter circuit in an example embodiment. Here, the level-up shifter comprises one fewer MOSFET than the circuit of FIG. 1, and completely shuts off the DC path from VDDO to ground when transmitting either logical 1 or 0. With proper device sizing, this design can produce a near ideal 50-50 duty cycle waveform at its output even over process, voltage and temperature (PVT) variation at high speed. Operation of the level-up shifter of FIG. 2 is described in further detail below with reference to FIG. 2.

Figure 3:
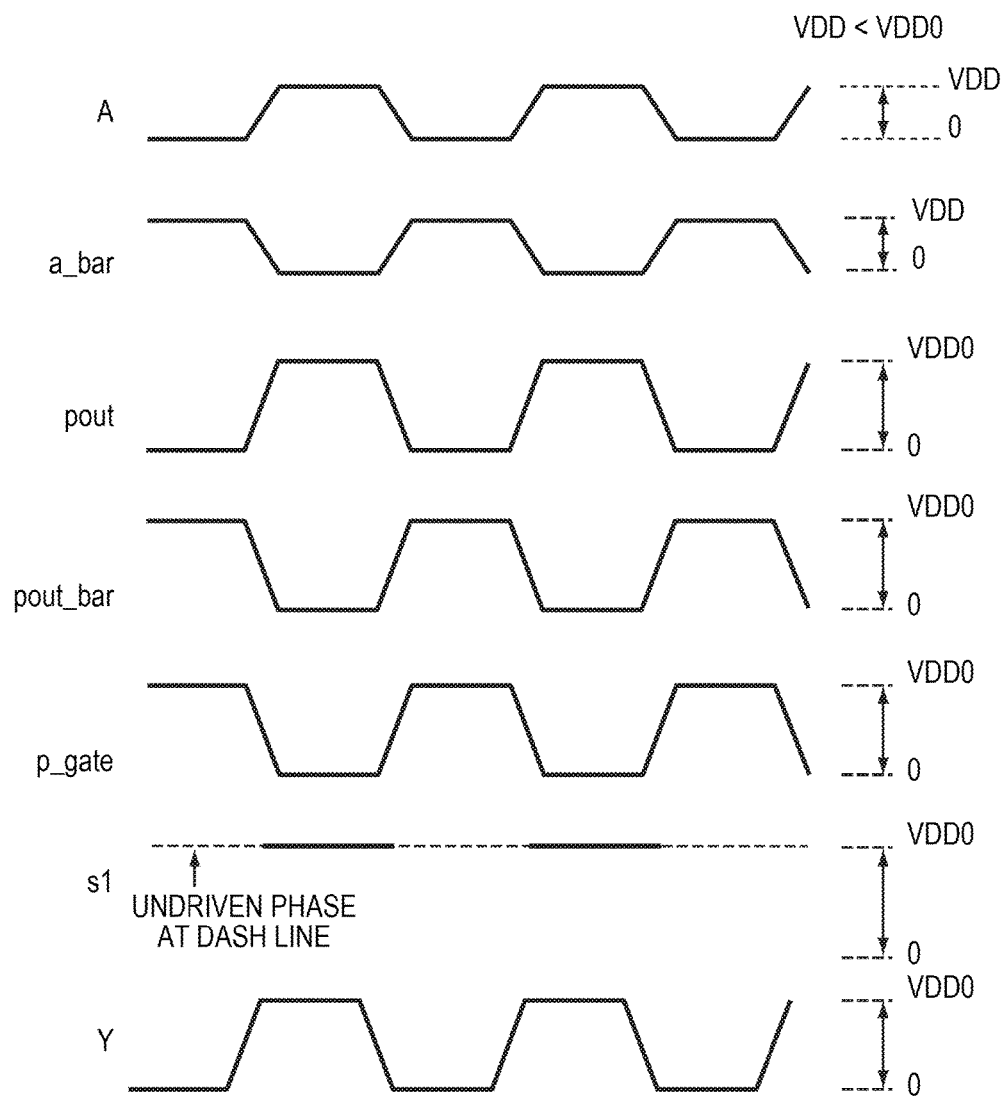
FIG. 3 is a timing diagram of the level-up shifter circuit of FIG. 2.

FIG. 3 is a timing diagram of the level-up shifter circuit of FIG. 2 under operation. When A=logical 1 and VDD<VDDO, NFET N2 is turned on and PFET P3 is turned off, therefore node p_gate is pulled down to ground by N2. Since node p_gate is now at logical 0, PFET P1 is turned on subsequently. Meanwhile, node a_bar becomes logical 0 so PFET P2 is then turned on and NFET N1 is turned off completely. At this state, node pout is charged to VDDO through PFET P1 and P2, and it is certain that there is no DC path from node pout to ground since NFET N1 is turned off when its gate is driven by logical 0. Because node pout is now at VDDO, node pout_bar becomes logical 0 and output node Y becomes logical 1 (VDDO) as a result. Since both source and drain of PFET P3 is now at logical 0 and gate of P3 at VDD, there is no current flowing through P3 either.

When A=logical 0 and VDD<VDDO, NFET N2 is turned off and the gate of PFET P3 is driven to logical 0. P3 is going to be turned on depending on the Vgs level, which is if node pout_bar rises above the threshold voltage of P3. Meanwhile, node a_bar is at logical 1 or VDD, and therefore NFET N1 is turned on completely and the condition of PFET P2 being off depends on the Vgs, or the voltage difference between node s1 and a_bar. With N1 being on, it pulls node pout to ground and turns node pout_bar to logical 1 (VDDO) subsequently. With node pout_bar raises from 0 to VDDO, node p_gate is tracked with it as well, and as a result it completely turns off PFET P1. Since Vgs of P1 is now at 0 v, the current flowing through the source and drain of P1 is eliminated. At this point, output node Y is driven to logical 0 and there is no DC current from VDDO to ground in this scenario either.

Figure 4:
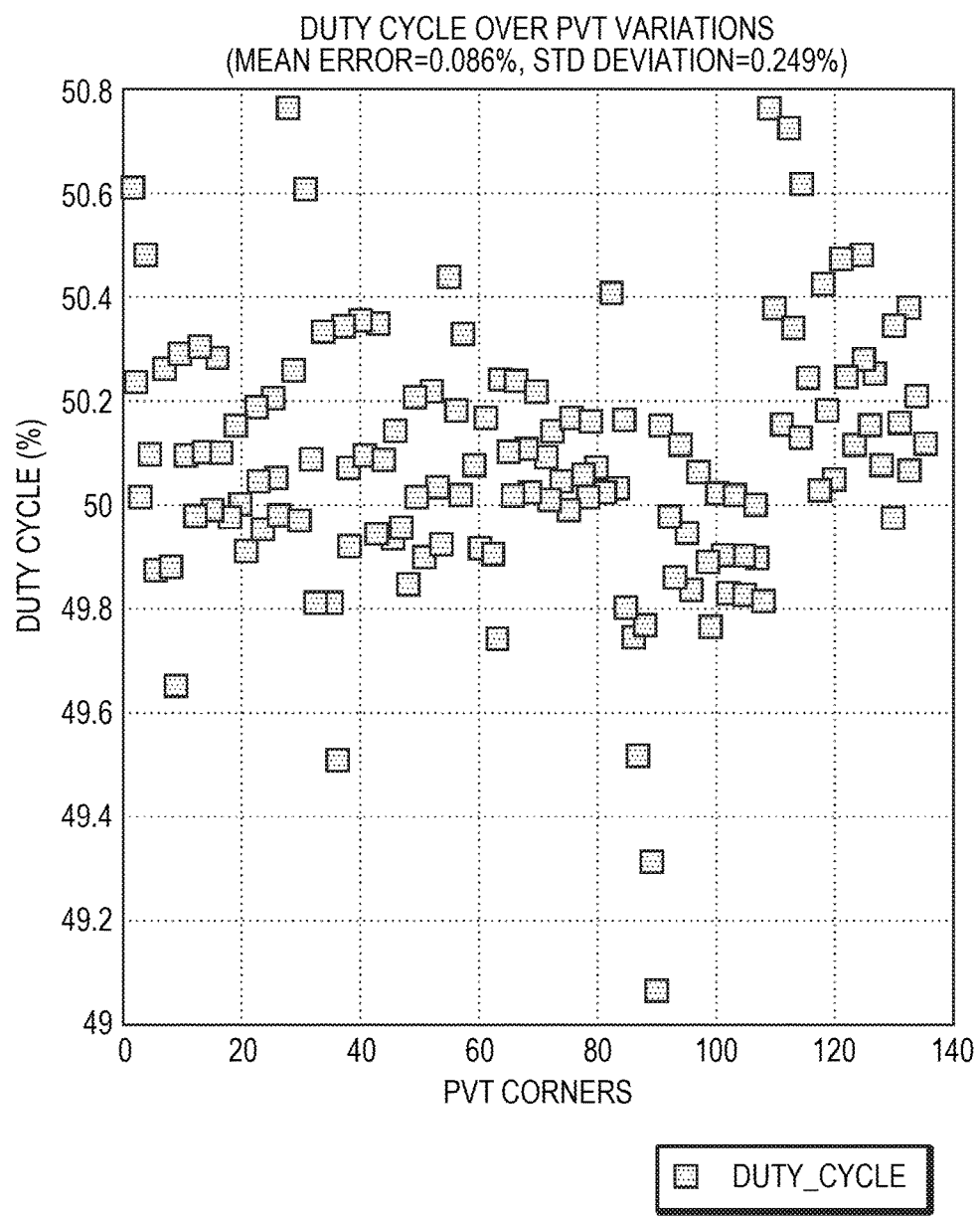
FIG. 4 is a chart of simulated duty cycles over PVT variations.

FIG. 4 is a chart of simulated duty cycles over PVT variations. To demonstrate the robustness of this level-up shifter, a VDD vs VDDO combination may be simulated as described below. With proper device sizing, this circuit can also be used with different VDD vs VDDO combinations. In this case, a nominal VDD voltage at 1.1 v and a nominal VDDO voltage at 1.5 v are used for simulations. To further stress this circuit, the following process, voltage and temperature (PVT) variations are used to come up 135 corner simulations: the process is swept through TT, FF, SS, SF, and FS corners; the VDD voltage is varied from 0.9 v, 1.1 v to 1.225 v; the VDDO voltage is tested with 1.4 v, 1.5 v and 1.6 v; and the temperature is varied from −40° c., 60° c., to 110° c. Over such extreme PVT variations, the example data of FIG. 4 demonstrates that the level-up shifter of FIG. 2 still maintains excellent duty cycle fidelity. The ideal goal is to achieve a duty cycle with 50%, and this circuit maintains the mean duty cycle at 50.086%, with standard deviation of ±0.249%.

Figure 5:
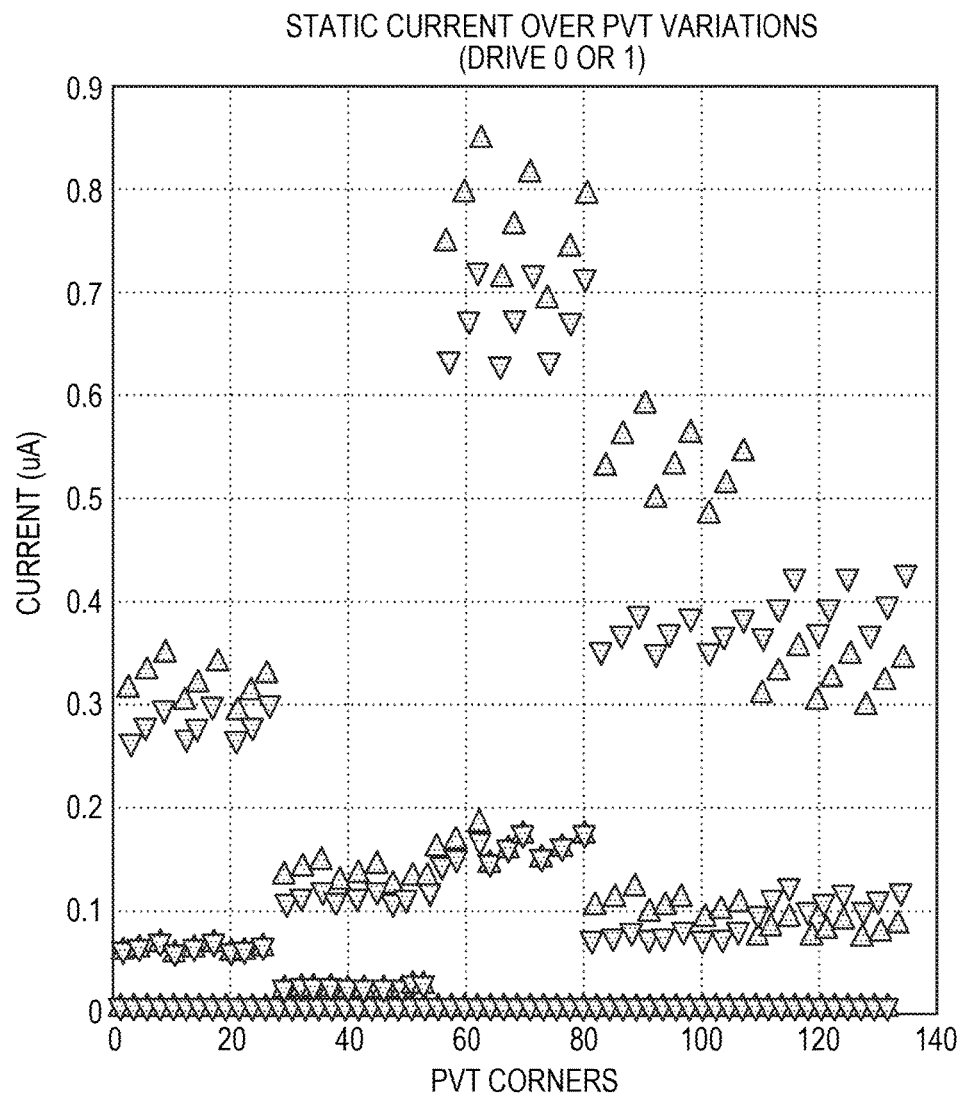
FIG. 5 is a chart of simulated static current over PVT variations.

FIG. 5 is a chart of simulated static current over PVT variations. In terms of power consumption, unlike the conventional high speed level-up shifter, the level-up shifter of FIG. 2 consumes almost no DC current or static current when driving a constant logical 0 or logical 1. FIG. 5 demonstrates that, over the same PVT variations applied as shown in FIG. 4, the circuit only dissipates 0.85 uA of current as a worst case, which is almost no DC current at all. This means this level-up shifter will not consume any static power when in standby mode or driving a logical 0 or logical 1. Therefore, it also eliminates the requirement of having an enable function as prior art does.

Example embodiments provide a significant power improvement on static power dissipation, especially if it is being used on parallel IO interfaces. Any static power reduction on a single circuit entity can easily be multiplied by a big multiplication factor for a large number of instances being used. At the same time, the level-up shifter still meets the high speed requirement that delivers an acceptable 50-50 duty cycle over extreme PVT variations. In addition, the mechanism that shuts off DC current has no dependency on a difference between VDD and VDDO; it can be used extensively without the voltage difference being a gating factor. As modern chip designs demand higher speed and lower power, this level-up shifter can be widely adopted for any interface that needs a rail-to-rail signal transition from one lower power supply domain to another higher power supply domain.

A further advantage of the level-up shifter circuit of FIG. 2 is in providing a wider range of difference between the two power domains. In contrast, in the circuit of FIG. 1, if the voltage difference between two domains grows larger, the signal driven from the lower voltage domain cannot completely shut off the devices in the higher voltage domain, therefore causes a DC path to ground. Moreover, the circuitry may completely lose its functionality if the voltage difference is so large that the devices at high voltage domain can't be shut off at all from the signals generated from lower voltage domain. The circuit of FIG. 2 avoids this problem, as it does not rely on the signal from the lower voltage domain to shut off the devices in the higher voltage domain. Rather, it implements a feedback mechanism driven from the higher voltage domain, which can completely eliminate the DC path to ground even given a wide range of difference between two voltage levels.

Figure 6:
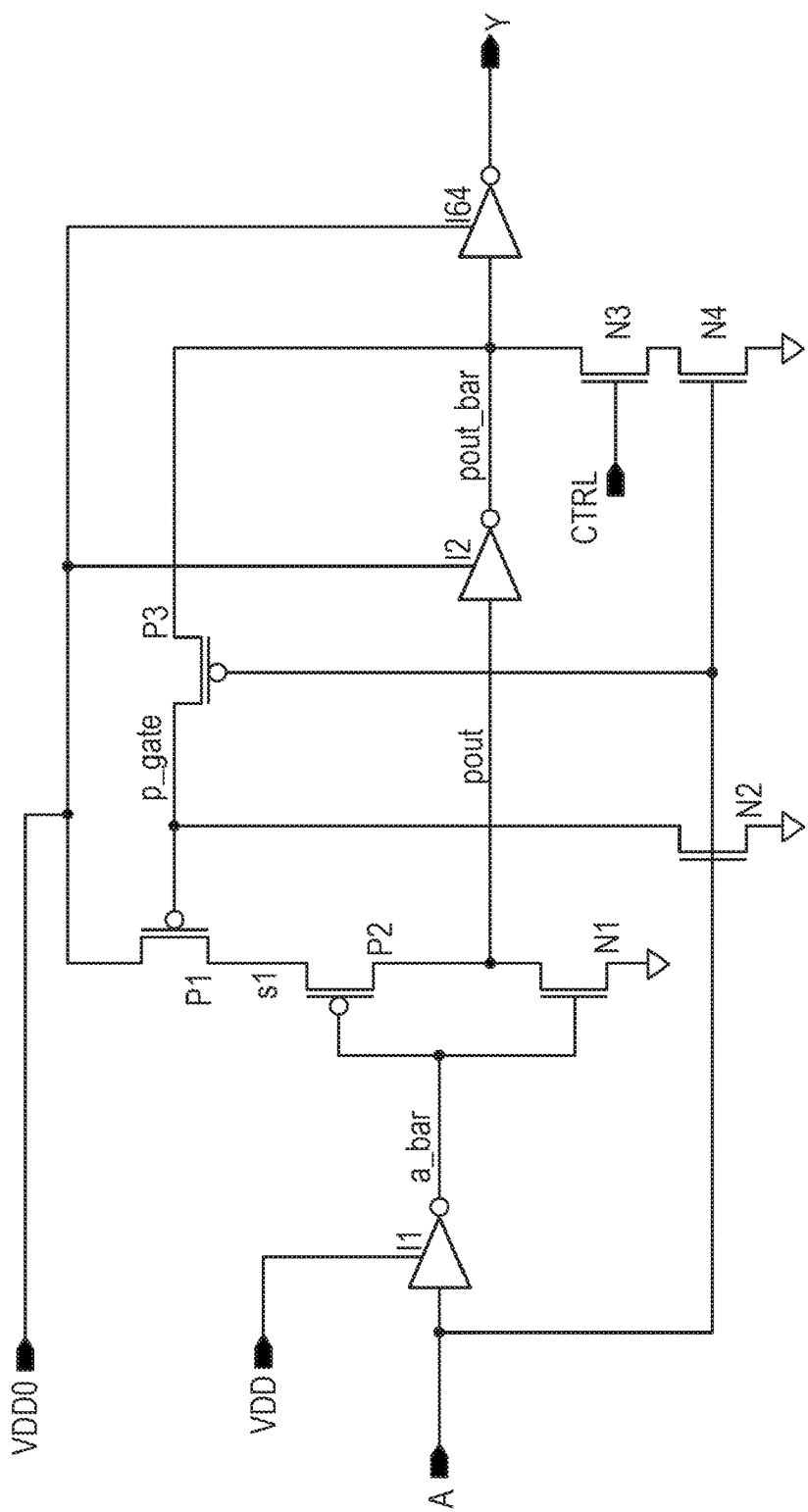
FIG. 6 is a circuit diagram of a level-up shifter circuit in a further example embodiment.

FIG. 6 is a circuit diagram of a level-up shifter circuit in a further example embodiment. The circuit may incorporate features described above with reference to FIG. 2, and may operate in a manner comparable to the embodiments described above. In addition to the aforementioned features, the level-up shifter circuit of FIG. 6 further includes NFETs N3 and N4 connected in series between the ground rail and a node between the output buffers 12, 164. The gate of NFET N3 may be connected to a control signal CTRL, and the gate of NFET N4 may be connected to the input signal A.

In applications where a level-up shifter circuit operates over a broad range of power domain crossing, the level-up shifter of FIG. 6 may provide further advantages. In particular, NFETs N3 and N4 can ensure duty cycle fidelity. For example, the device sizing and beta ratio may be optimized to maintain a mean duty cycle at 50% with a tight standard deviation when voltage domain 1 with voltage value=X and voltage domain 2 with voltage value=Y, where the circuit can maintain an acceptable duty cycle even there are voltage variations from X and Y by +−10%. However, due to a design requirement, voltage domain 2 may be changed to a voltage value at Z, which may be more than 20% different from the original voltage value Y, while still tolerating a +−10% variation from Z. As a result, the mean duty cycle may be deviated from 50% without modifying any device sizing, although the standard variation of the duty cycle may still be maintained. To address this deviation, the gate control signal CTRL to NFET N3 may be activated to bias the mean duty cycle back to 50% point. The level-up shifter circuit may therefore accommodate a broader voltage domain.

Further to the aforementioned example, the control signal CTRL may be driven from voltage domain 1, and may be constantly asserted "high" when voltage value Z is present or the circuit is required to accommodate voltage value Z. When both input A and control signal CTRL are with logic 1, NFET N3 will provide more pull-down current from the node between the output buffers 12, 164, in addition to the existing pull-down force generated from the buffer 12. Thus, the overall pull-down force may be increased, and therefore the duty cycle may be altered at such node and onward. As a result, the mean duty cycle at the output Y may return to 50%.

Due to process variation, the duty cycle may deviate from its ideal nominal center point. In order to indicate process variation between NMOS and PMOS devices, labels for process corners may be used. For example the labels TT, SS, FF, SF and FS (T is typical, S is slow and F is fast) may be used to designate different process corners resulting from process variation, as defined by the foundry manufacturing the devices. Under such a labeling system, the first letter may indicate the NMOS devices, and the second letter may indicate the PMOS devices.

Duty cycle distortion is one of the sources that reduces timing margin. It becomes relatively more significant in effect when operating speed becomes higher as a result of improved circuit technology. The process variation causing such distortion may become even more difficult to control by the manufacturer due to process shrink. Example embodiments of the invention provide a solution to calibrate the duty cycle on each die to compensate for process variation.

Figure 7:
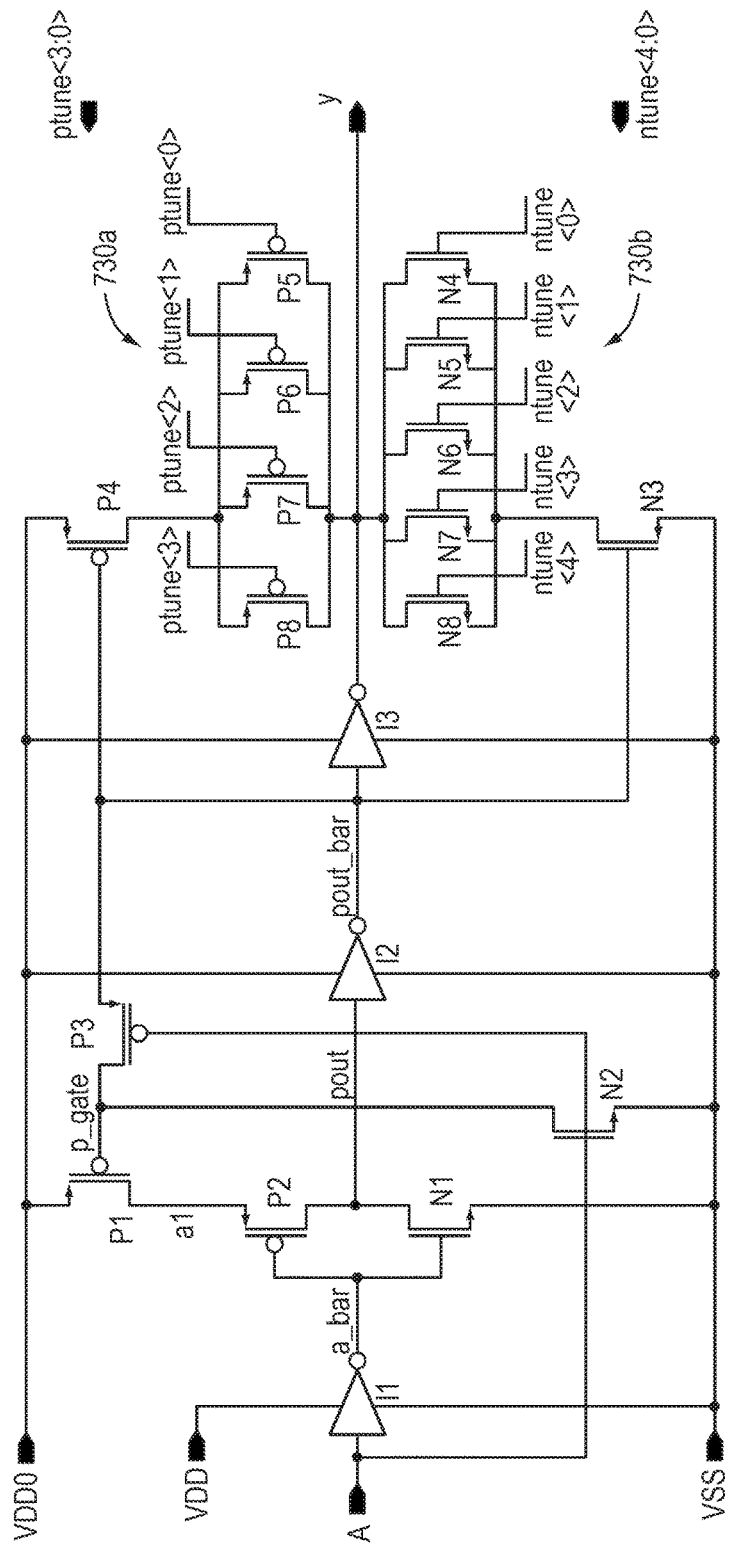
FIG. 7 is a circuit diagram of a process-compensated level-up shifter circuit in an example embodiment.

FIG. 7 is a circuit diagram of a process-compensated level-up shifter circuit 700 in an example embodiment. The circuit 700 may incorporate the features of the level-up shifter circuits described above with reference to FIGS. 2 and 6, and further includes compensation circuits 730a-b at the output of the circuit. The compensation circuits 730a-b includes control transistors PFET P4 and NFET N3, a plurality of PFETs P5-P8 connected in parallel, and a plurality of NFETs N4-N8 connected in parallel. The PFETs P5-P8 operate as a variable resistor adjustable via inputs PTUNE0-3, and the NFETs N4-N8 operate as a variable resistor adjustable via inputs NTUNE0-4. By adjusting these variable resistors, the output of the level-up shifter can be configured to compensate for process variation. Thus, in the pull-up path, transistor PFET P4 enables the pull-up path, while PFETs P5-P8 control the strength of the pull-up path. Likewise, in the pull-down path, transistor NFET N3 enables the pull-down path, while NFETs N4-N8 control the strength of the pull-down path.

Figure 8:
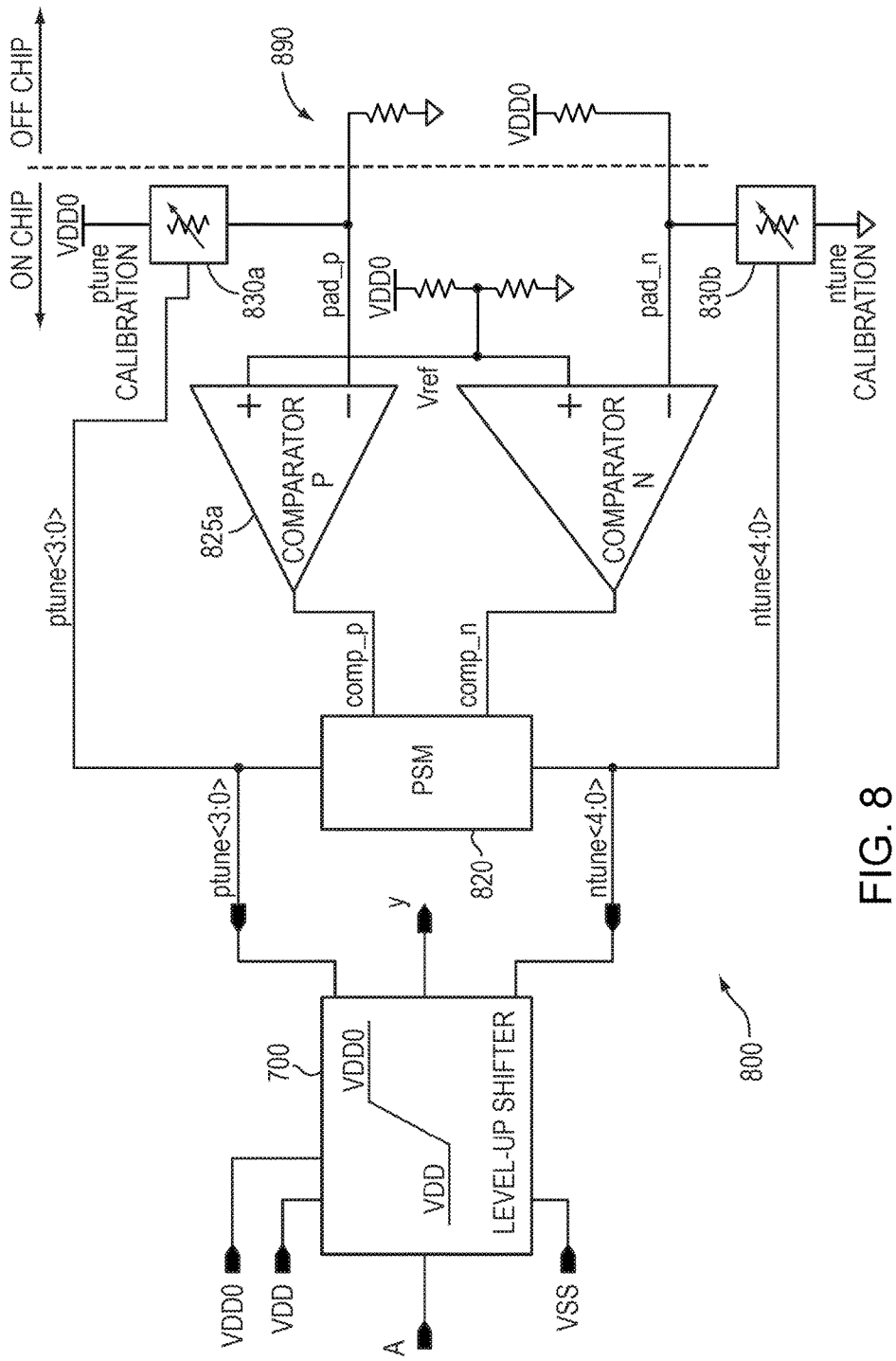
FIG. 8 is a circuit diagram of a calibration circuit.

FIG. 8 is a circuit diagram of a calibration circuit 800 for configuring the process compensation of a level-up shifter circuit such as the circuit 700 of FIG. 7. The calibration circuit 800 includes a finite state machine (FSM) 820, comparators 825a-b, and variable resistors 830a-b. In addition, off-chip resistors 890 provide a stable reference for on-chip resistor calibration. The off-chip resistors 890 may provide accuracy down to ±0.1%, while on-chip variation may be up to ±20-30%. The calibration circuit 800 determines the values for PTUNE0-3 and NTUNE0-4, which are then provided to the level-up shifter circuit 700.

In operation, the calibration circuit 800 may compare the reference voltage (Vref) against the voltages at the variable resistors 830a-b. Based on this comparison, the FSM 820 may calibrate the variable pull-up and pull-down resistances of the variable resistors 830a-b individually by adjusting PTUNE0-3 and NTUNE0-4 such that eventually effective pull-up and pull-down resistance match the value of the off-chip resistors 890. The comparator 825a-b outputs switch when two inputs are crossed over, indicating a match. The final ptune and ntune settings may then be recorded and forwarded to the level-up shifter 700. In alternative embodiments, the numbers of PTUNE and NTUNE bits of the variable resistors 830a-b may be larger or smaller. The effectiveness of calibration can be dependent on the correlation between the calibration logic versus the level-up shifter, which can reuse the calibration setting.

Figure 9:
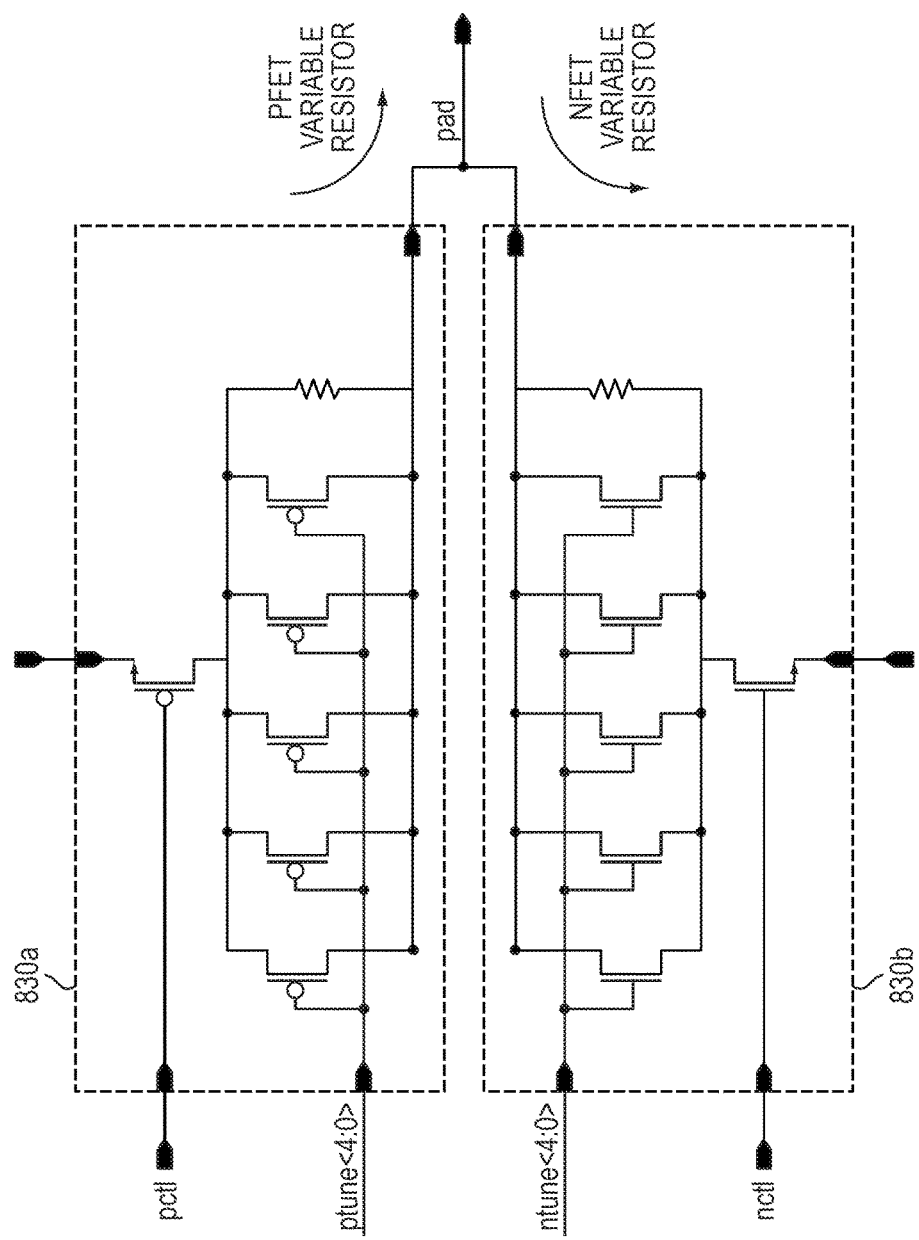
FIG. 9 is a circuit diagram of calibration logic providing calibration settings for a level-up shifter in an example embodiment.

FIG. 9 is a circuit diagram of the variable resistors 830a-b of the calibration circuit 800 of FIG. 8. The variable resistors 830a-b may mirror, wholly or in part, the logic of the compensation circuits 730a-b of the level-up circuit 700. In particular, inputs pctl and nctl can operate control gates to select the pull-up or pull-down path being calibrated. Ptune<*> and ntune<*> connect to respective gates of parallel transistors, and indicate the calibration setting being adjusted across PVT corners to provide a consistent, effective resistance irrespective to the PVT variation. The effective resistance for the pull-up and pull-down paths may be contributed partly from the passive resistor and active MOS-based resistor together. Alternative embodiments may employ an all-active MOS-based resistor. Increasing resistance weighting on the active MOS-based resistor can further improve process compensation for the duty cycle distortion on the level-up shifter.

Figure 10:
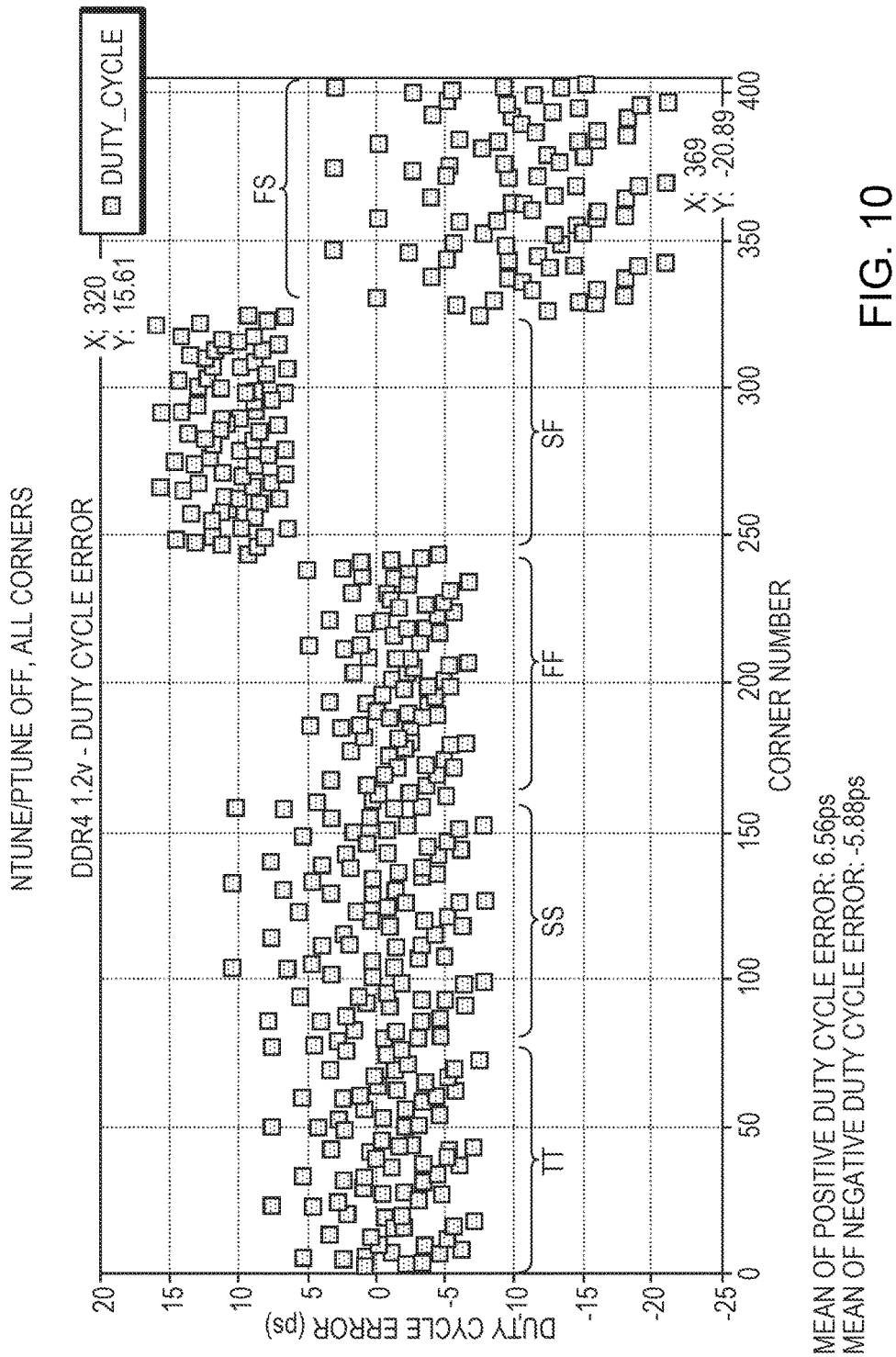
FIG. 10 is a chart of simulated duty cycles without process compensation over PVT variations.

FIG. 10 is a chart of simulated duty cycles without process compensation over PVT variations. The variations of 405 corners were simulated. This example includes the following combinations:

5 NFET/PFET process corners: TT, SS, FF, SF and FS
3 resistor process corners: T, S, F
3 core voltage corners: 0.85 v, 0.85 v−10%, 0.85 v+10%.
3 IO voltage corners: 1.2 v, 1.2 v−5%, 1.2 v+5%.
3 temperature corners: 60 c, −40 c, 110 c.

The above variations total 405 corners. As shown, the mean positive duty cycle error is 6.56 ps, and the mean negative duty cycle error is −5.88 ps.

Figure 11:
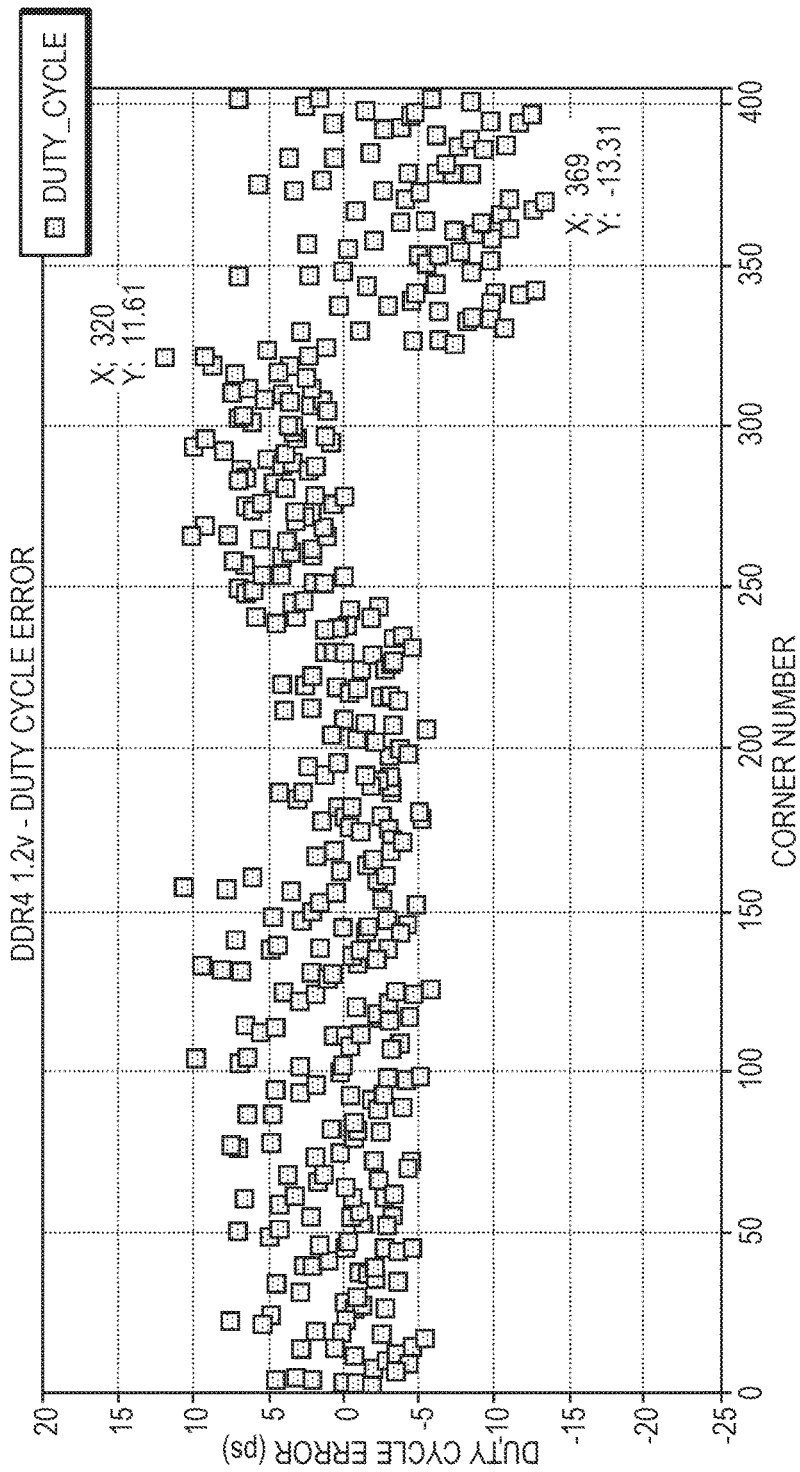
FIG. 11 is a chart of simulated duty cycles with process compensation over PVT variations.

FIG. 11 is a chart of simulated duty cycles as a result process compensation over PVT variations as provided by an example embodiment. In contrast to the results of FIG. 10, the mean positive duty cycle error is 3.73 ps, and the mean negative duty cycle error is −3.77 ps. Further, the worst-case duty cycle error was reduced by ~36%, and the overall duty cycle across corners was reduced in general. The mean of positive duty cycle error was reduced significantly, by roughly 76%. The mean of negative duty cycle error was reduced by roughly 56%. Thus, example embodiments effectively reduce the duty cycle error and successfully compensate for process, voltage and temperature variations. Further embodiments may provide even greater improvements in duty cycles than those shown in FIG. 11.

While this invention has been particularly shown and described with references to example embodiments thereof, it will be understood by those skilled in the art that various changes in form and details may be made therein without departing from the scope of the invention encompassed by the appended claims.

What is claimed is:

1. A level-up shifter circuit comprising:
a first buffer configured to receive an input signal in a first power domain;
first, second and third transistors connected in series between a source rail in a second power domain and a ground rail, gates of the second and third transistors connected to the output of the first buffer, the second power domain being distinct from the first power domain;
second and third buffers connected in series, an output of the second buffer being connected to an input of the third buffer, an input of the second buffer being connected to a node between the second and third transistors, the third buffer outputting an output signal in the second power domain;
fourth and fifth transistors having respective gates connected to the input signal and respective drains connected to a gate of the first transistor; and
a compensation circuit comprising:
a first variable resistor connected between the source rail in the second power domain and an output of the third buffer; and
a second variable resistor connected between the ground rail and the output of the third buffer; and
at least one control transistor having a gate connected to the output of the second buffer.

2. The level-up shifter circuit of claim 1, wherein the first variable resistor includes a plurality of transistors connected in parallel.

3. The level-up shifter circuit of claim 1, wherein the second variable resistor includes a plurality of transistors connected in parallel.

4. The level-up shifter circuit of claim 1, wherein the at least one control transistor is connected in series with at least one of the first and second variable resistors.

5. The level-up shifter circuit of claim 1, wherein at least one of the first, second and third buffers include an inverter.

6. The level-up shifter circuit of claim 1, wherein the first buffer is configured to be powered by a power signal in the first power domain.

7. The level-up shifter circuit of claim 1, wherein the second and third buffers are configured to be powered by a power signal in the second power domain.

8. The level-up shifter circuit of claim 1, wherein the first power domain corresponds to a power domain of a central processing unit.

9. The level-up shifter circuit of claim 8, wherein the second power domain corresponds to a power domain of a communications bus for interfacing with the central processing unit.

10. The level-up shifter circuit of claim 1, wherein the third buffer maintains the output signal at a substantially constant duty cycle corresponding to a high-speed input signal.

11. The level-up shifter circuit of claim 1, wherein the third buffer maintains the output signal at a substantially constant duty cycle across substantial variations in process, voltage and temperature variations at the level-up shifter circuit.

12. The level-up shifter circuit of claim 1, wherein the level-up shifter is configured to minimize static current consumption when in an idle state.

13. The level-up shifter circuit of claim 1, wherein the fourth transistor has a source connected to the node between the second and third buffers.

14. The level-up shifter circuit of claim 1, wherein the node between the second and third buffers is connected to the gate of the first transistor via the fourth transistor.

15. A level-up shifter circuit comprising:
a first buffer configured to receive an input signal in a first power domain;
first, second and third transistors connected in series between a source rail in a second power domain and a ground rail, gates of the second and third transistors connected to the output of the first buffer, the second power domain being distinct from the first power domain;
second and third buffers connected in series, an output of the second buffer being connected to an input of the third buffer, an input of the second buffer being connected to a node between the second and third transistors, the third buffer outputting an output signal in the second power domain;
fourth and fifth transistors having respective gates connected to the input signal and respective drains connected to a gate of the first transistor; and
a compensation circuit comprising:
a first variable resistor connected between the source rail in the second power domain and an output of the third buffer; and a second variable resistor connected between the ground rail and the output of the third buffer; and a calibration circuit configured to adjust resistance values of the first and second variable resistors.

16. The level-up shifter circuit of claim 15, wherein the calibration circuit includes a finite state machine configured to output a plurality of calibration values to the first and second variable transistors.

17. The level-up shifter circuit of claim 16, wherein the calibration circuit includes at least one comparator configured to compare a voltage based on the plurality of calibration values against a reference voltage and output a comparison value to the finite state machine.

18. The level up shifter circuit of claim 17, wherein the finite state machine adjusts the plurality of calibration values based on the comparison value.

* * * * *